(12) United States Patent
Hirano et al.

(10) Patent No.: US 11,031,270 B2
(45) Date of Patent: Jun. 8, 2021

(54) SUBSTRATE PROCESSING APPARATUS, SUBSTRATE HOLDER AND MOUNTING TOOL

(71) Applicant: KOKUSAI ELECTRIC CORPORATION, Tokyo (JP)

(72) Inventors: Atsushi Hirano, Toyama (JP); Yuji Takebayashi, Toyama (JP); Yukinao Kaga, Toyama (JP); Masanori Sakai, Toyama (JP); Masakazu Shimada, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/100,384

(22) Filed: Aug. 10, 2018

(65) Prior Publication Data

US 2018/0374734 A1 Dec. 27, 2018

Related U.S. Application Data

(63) Continuation of application No. PCT/JP2016/078220, filed on Sep. 26, 2016.

(30) Foreign Application Priority Data

Feb. 10, 2016 (JP) .............................. JP2016-023625

(51) Int. Cl.
*C23C 16/458* (2006.01)
*H01L 21/673* (2006.01)
(Continued)

(52) U.S. Cl.
CPC ............ *H01L 21/683* (2013.01); *C23C 16/34* (2013.01); *C23C 16/458* (2013.01);
(Continued)

(58) Field of Classification Search
CPC ................. C23C 16/458; H01L 21/683; H01L 21/67309
See application file for complete search history.

(56) References Cited

U.S. PATENT DOCUMENTS 5,458,688 A * 10/1995 Watanabe ......... H01L 21/67309
118/724
5,752,609 A * 5/1998 Kato ................. H01L 21/67309
118/500
(Continued)

FOREIGN PATENT DOCUMENTS

JP 62-16516 A 1/1987
JP 07-037973 A 2/1995
(Continued)

OTHER PUBLICATIONS

International Search Report, PCT/JP2016/078220, dated Nov. 1, 2016, 3 pgs.
(Continued)

*Primary Examiner* — Binu Thomas
(74) *Attorney, Agent, or Firm* — Volpe Koenig

(57) ABSTRACT

A substrate processing apparatus, includes: a substrate holder including at least one support column to which a mounting part on which a substrate is mounted is attached and at least one auxiliary support column to which the mounting part is not attached, wherein the substrate holder is configured such that a diameter of the auxiliary support column is smaller than a diameter of the support column, and wherein the substrate holder is configured such that when the substrate is held by the mounting part, an end portion of the substrate and each of the support column is spaced apart from each other by a predetermined length.

9 Claims, 12 Drawing Sheets

(51) Int. Cl.
   *H01L 21/683* (2006.01)
   *C23C 16/34* (2006.01)
   *C23C 16/455* (2006.01)
   *H01L 21/67* (2006.01)
   *H01L 21/285* (2006.01)
   *H01L 21/68* (2006.01)

(52) U.S. Cl.
   CPC ...... *C23C 16/4583* (2013.01); *C23C 16/4585* (2013.01); *C23C 16/45525* (2013.01); *C23C 16/45591* (2013.01); *H01L 21/28506* (2013.01); *H01L 21/67017* (2013.01); *H01L 21/67109* (2013.01); *H01L 21/67303* (2013.01); *H01L 21/67309* (2013.01); *H01L 21/68* (2013.01)

(56) References Cited

U.S. PATENT DOCUMENTS

| | | | |
|---|---|---|---|
| 6,361,313 B1* | 3/2002 | Beyaert | H01L 21/67309 211/41.18 |
| 2006/0205213 A1* | 9/2006 | Ozaki | H01L 21/67309 118/715 |
| 2007/0007646 A1* | 1/2007 | Yamaguchi | H01L 21/67309 257/727 |
| 2008/0185308 A1* | 8/2008 | Herzog | H01L 21/67309 206/445 |
| 2018/0019144 A1* | 1/2018 | Ogitsu | H01L 21/67309 |

FOREIGN PATENT DOCUMENTS

| | | |
|---|---|---|
| JP | 10-022227 A | 1/1998 |
| JP | 3167301 B1 | 5/2001 |
| JP | 2005-228991 A | 8/2005 |
| JP | 2014-103280 A | 6/2014 |
| KR | 10-0557857 B1 | 3/2006 |

OTHER PUBLICATIONS

Japanese Office Action dated Dec. 5, 2018 for the Japanese Patent Application No. 2017-566505.
Korean Office Action dated Jan. 6, 2020 for the Korean Patent Application No. 10-2018-7022564.
Korean Office Action dated Jul. 23, 2020 for Korean Patent Application No. 10-2018-7022564.

* cited by examiner

SUBSTRATE PROCESSING APPARATUS, SUBSTRATE HOLDER AND MOUNTING TOOL

CROSS-REFERENCE TO RELATED APPLICATION

This application is a Bypass Continuation Application of PCT International Application No. PCT/JP2016/078220, filed Sep. 26, 2016, which claimed the benefit of Japanese Patent Application No. 2016-023625, filed on Feb. 10, 2016, the entire contents of which are incorporated herein by reference.

TECHNICAL FIELD

The present disclosure relates to a substrate processing apparatus, a substrate holder and a mounting tool.

BACKGROUND

In a semiconductor manufacturing apparatus, which is a type of substrate processing apparatus, a boat loaded with wafers as substrates is charged into a furnace heated to a predetermined temperature by a heater as a heating means. The inside of the furnace is evacuated. A reaction gas is introduced from a reaction gas introducing pipe to process the surfaces of the wafers. An exhaust gas is exhausted from an exhaust pipe. The boat includes a plurality of support columns. A plurality of wafers is horizontally held by grooves formed in the support columns.

For example, in the related art, a structure has been used in which a boat loaded into a vertical furnace while holding wafers is opened over the entire length of the boat. With this configuration, the region (heat insulating region) in which a heat insulating plate is loaded is completely opened. Therefore, there is an effect that the reaction gas does not stay in the furnace when gas purging is performed after processing.

In the semiconductor manufacturing apparatus equipped with the vertical furnace as described above, the distance between the boat and the wafers is short. Thus, a film is also formed on a surface of the boat at the time of film formation. For this reason, a gas concentration around the boat tends to decrease. Along with recent miniaturization of patterns, such an influence of gas consumption by the boat may lead to deterioration of a substrate quality.

SUMMARY

The present disclosure provides some embodiments of a configuration capable of ignoring an influence of gas consumption by a boat.

According to an embodiment of the present disclosure, there is provided a configuration that includes a substrate holder. The substrate holder includes: at least one support column to which a mounting part on which a substrate is mounted is attached; and at least one auxiliary support column to which the mounting part is not attached, wherein the substrate holder is configured such that a diameter of the auxiliary support column is smaller than a diameter of the support column, and wherein the substrate holder is configured such that when the substrate is held by the mounting part, an end portion of the substrate and each of the support column is spaced apart from each other by a predetermined length.

Figure 1:
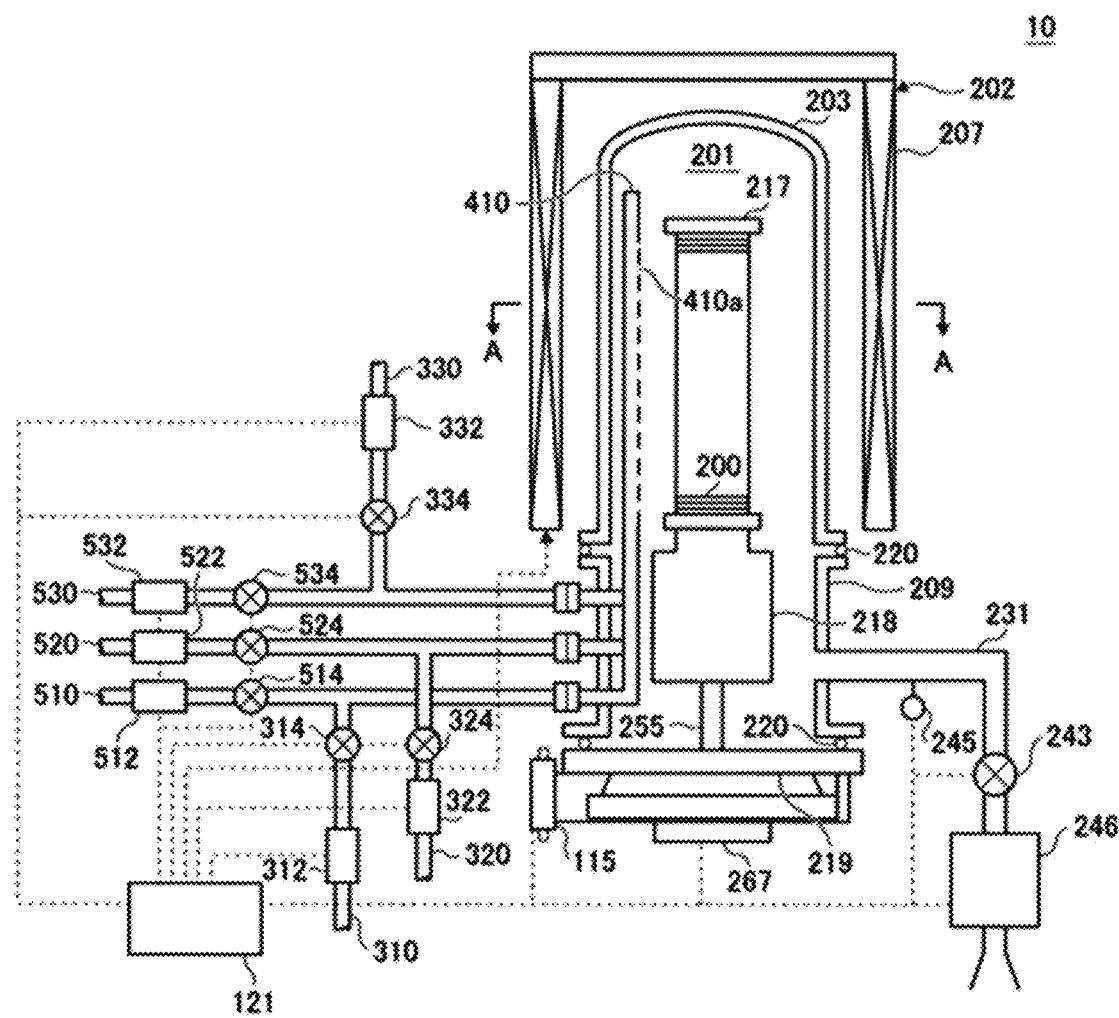
FIG. 1 is a vertical sectional view of a substrate processing apparatus suitably used in an embodiment of the present disclosure.

DETAILED DESCRIPTION (1) Configuration of Substrate Processing Apparatus

Hereinafter, an embodiment will be described with reference to the drawings. In the following description, identical constituent elements will be denoted by identical reference numerals, and the repeated description thereof will be omitted. In order to make the explanation clearer, a width, a thickness, a shape and the like of each part may be schematically illustrated in the drawings compared to the actual ones. However, this is nothing more than one example and is not intended to limit an interpretation of the present disclosure.

Figure 2:
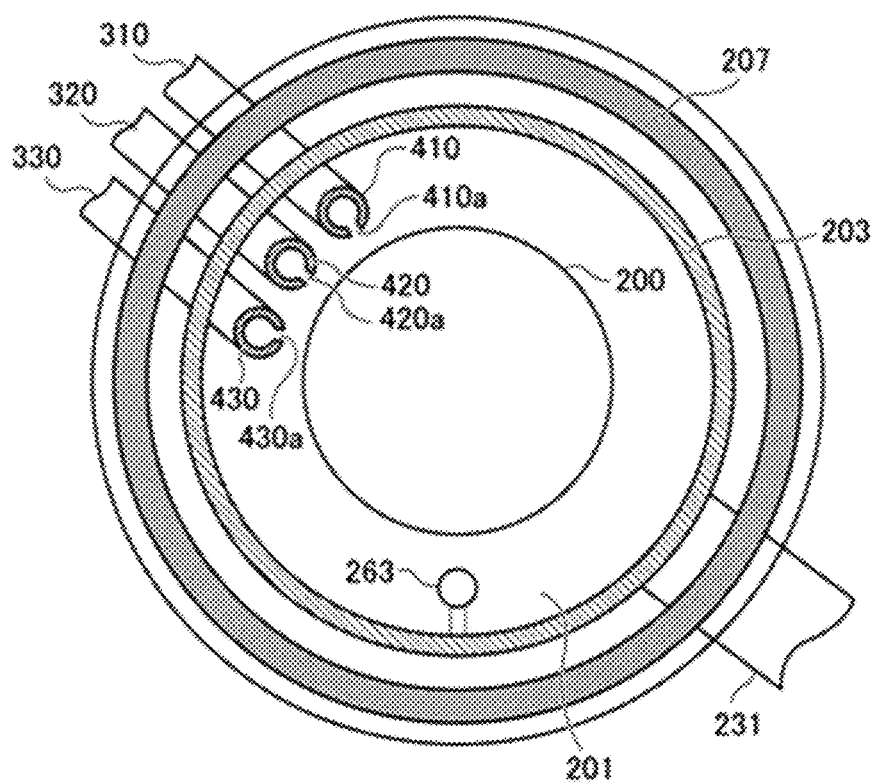
FIG. 2 is a sectional view taken along line A-A in FIG. 1.

Next, an embodiment for carrying out the present disclosure will be described based on the drawings. In FIGS. 1 and 2, there is shown a substrate processing apparatus 10 that may be used in an embodiment of the present disclosure. The substrate processing apparatus 10 is configured as an example of a semiconductor manufacturing apparatus used for manufacturing a semiconductor device.

<Configuration of Process Furnace>

As shown in FIGS. 1 and 2, a heater 207 as a heating part for heating wafers (substrates) 200 is installed in a process furnace 202. Inside the heater 207, a reaction tube 203 constituting a reaction container (process container) is disposed concentrically with the heater 207. The reaction tube 203 is made of a heat-resistant material such as, for example, quartz ($SiO_2$) or the like and is formed in a cylindrical shape with its upper end closed and its lower end opened.

A manifold 209 made of, for example, stainless steel or the like is attached to the lower end of the reaction tube 203. The manifold 209 is formed in a tubular shape, and a lower end opening thereof is airtightly closed by a seal cap 219 which is a lid. O-rings 220 are respectively provided between the reaction tube 203 and the manifold 209 and between the manifold 209 and the seal cap 219. A process chamber 201 is formed by the reaction tube 203, the manifold 209 and the seal cap 219. A boat 217 serving as a substrate holding part is installed upright on the seal cap 219 via a boat support base 218.

In the boat 217, a plurality of wafers 200 to be batch-processed are stacked vertically in a horizontal posture in multiple stages. The boat 217 can be raised and lowered with respect to the reaction tube 203 by a boat elevator 115. A boat rotation mechanism 267 for rotating the boat 217 to improve processing uniformity is installed at a lower end portion of the boat support base 218. The heater 207 heats the wafers 200 inserted into the process chamber 201 to a predetermined temperature.

A nozzle 410 (a first nozzle 410), a nozzle 420 (a second nozzle 420), a nozzle 430 (a third nozzle 430) are installed in the process chamber 201 so as to penetrate a lower portion of the reaction tube 203. A gas supply pipe 310 (a first gas supply pipe 310), a gas supply pipe 320 (a second gas supply pipe 320) and a gas supply pipe 330 (a third gas supply pipe 330) as gas supply lines are connected to the nozzle 410, the nozzle 420 and the nozzle 430, respectively. In this way, three nozzles 410, 420 and 430 and three gas supply pipes 310, 320 and 330 are installed in the reaction tube 203 and are configured to be able to supply a plurality of gases, for example, three kinds of gases (process gases) to the process chamber 201.

In the gas supply pipe 310, a mass flow controller (WC) 312, which is a flow rate control device (flow rate control part), and a valve 314, which is an opening/closing valve, are installed in order from the upstream side. A nozzle 410 is connected to a tip portion of the gas supply pipe 310. The nozzle 410 is configured as an L-shaped long nozzle, and a horizontal portion thereof is installed so as to penetrate a side wall of the manifold 209. A vertical portion of the nozzle 410 is installed in an arc-shaped space, which is formed between an inner wall of the reaction tube 203 and the wafers 200, so as to extend upward along the inner wall of the reaction tube 203 (in a stacking direction of the wafers 200) (in other words, so as to extend upward from one end side to the other end side of a wafer arrangement region). That is, the nozzle 410 is installed along the wafer arrangement region in a region horizontally surrounding the wafer arrangement region on a lateral side of the wafer arrangement region where the wafers 200 are arranged.

Gas supply holes 410a for supplying a gas are provided on the side surface of the nozzle 410. The gas supply holes 410a are opened so as to face the center of the reaction tube 203. The gas supply holes 410a are provided from the lower part to the upper part of the reaction tube 203. The gas supply holes 410a have the same opening area or opening areas different in size. Further, the gas supply holes 410a are provided at the same opening pitch. A first gas supply system mainly includes the gas supply pipe 310, the MFC 312, the valve 314 and the nozzle 410.

In addition, a carrier gas supply pipe 510 for supplying a carrier gas is connected to the gas supply pipe 310. A first carrier gas supply system manly includes the carrier gas supply pipe 510, the MFC 512 and the valve 514.

In the gas supply pipe 320, an MFC 322 as a flow rate control device (flow rate control part) and a valve 324 as an opening/closing valve are installed in order from the upstream side. A nozzle 420 is connected to a tip portion of the gas supply pipe 320. The nozzle 420 is configured as an L-shaped long nozzle similar to the nozzle 410. Configuration of a horizontal portion and a vertical portion of the nozzle 420 is also the same as that of the nozzle 410.

Gas supply holes 420a for supplying a gas are provided on the side surface of the nozzle 420. The gas supply holes 420a are provided in the same configuration as the gas supply holes 410a. A second gas supply system mainly includes the gas supply pipe 320, the MFC 322, the valve 324 and the nozzle 420.

Furthermore, a carrier gas supply pipe 520 for supplying a carrier gas is connected to the gas supply pipe 320. A second carrier gas supply system mainly includes the carrier gas supply pipe 520, the MFC 522 and the valve 524.

In the gas supply pipe 330, an MFC 332 as a flow rate control device (flow rate control part) and a valve 334 as an opening/closing valve are installed in order from the upstream side. A nozzle 430 is connected to a tip portion of the gas supply pipe 330. Similar to the nozzle 410, the nozzle 430 is configured as an L-shaped long nozzle. Configuration of a horizontal portion and a vertical portion of the nozzle 430 is also the same as those of the nozzles 410 and 420.

Gas supply holes 430a for supplying a gas are provided on a side surface of the nozzle 430. The gas supply holes 430a are provided in the same configuration as the gas supply holes 410a and 420a. A third gas supply system mainly includes the gas supply pipe 330, the MFC 332, the valve 334 and the nozzle 430.

Further, a carrier gas supply pipe 530 for supplying a carrier gas is connected to the gas supply pipe 330. A third carrier gas supply system mainly includes the carrier gas supply pipe 530, the MFC 532 and the valve 534.

As described above, in a gas supply method according to the present embodiment, the gases are conveyed via the nozzles 410, 420 and 430 arranged in an arc-shaped vertically-elongated space defined by the inner wall of the reaction tube 203 and the end portions of the wafers 200 stacked one above another. The gases are first injected into the reaction tube 203 in the vicinity of the wafers 200 from the gas supply holes 410a, 420b and 430c respectively opened in the nozzles 410, 420 and 430. A main flow of the gas in the reaction tube 203 is moved in the direction parallel to the surfaces of the wafers 200, i.e., in the horizontal direction. With such a configuration, the gas may be uniformly supplied to the respective wafers 200 and a film thickness of a thin film formed on each wafer 200 may be made uniform. The residual gas after the reaction flows toward an exhaust port, i.e., toward the exhaust pipe 231 to be described later. However, a flow direction of the residual gas may be appropriately specified depending on a position of the exhaust port and is not limited to a vertical direction.

As an example of the above configuration, a precursor gas containing a first metal element, for example, titanium tetrachloride ($TiCl_4$), which is a Ti-containing precursor containing at least a titanium (Ti) element, is supplied from the gas supply pipe 310 into the process chamber 201 via the MFC 312, the valve 314 and the nozzle 410. In the case of using a liquid precursor such as $TiCl_4$ which remains in a liquid state under room temperature and an atmospheric pressure, the liquid precursor is vaporized by a vaporization system such as a vaporizer or a bubbler and is supplied as a $TiCl_4$ gas which is a Ti-containing gas.

A precursor gas containing carbon and a second metal element, for example, TMA (trimethylaluminum, $(CH_3)_3Al$) containing at least a carbon (C) element and an aluminum (Al) element, may be supplied from the gas supply pipe 320 into the process chamber 201 via the MFC 322, the valve 324 and the nozzle 420. In the case of using a liquid precursor such as TMA which remains in a liquid state, the liquid precursor is vaporized by a vaporization system such as a vaporizer or a bubbler and is supplied as a C- and Al-containing gas.

A precursor gas containing a nitrogen element, for example, ammonia ($NH_3$), is supplied from the gas supply pipe 330 into the process chamber 201 via the MFC 332, the valve 334 and the nozzle 430.

For example, a nitrogen ($N_2$) gas is supplied from the carrier gas supply pipes 510, 520 and 530 into the process chamber 201 via the MFCs 512, 522 and 532, the valves 514, 524 and 534, and the nozzles 410, 420 and 430.

In addition, for example, in the case of supplying the above-mentioned gases from the respective gas supply pipes, a metal-containing precursor supply system includes the first gas supply system. Further, a carbon-containing precursor supply system includes the second gas supply system. Further, a nitrogen-containing precursor supply system includes the third gas supply system. Further, similar to the first gas supply system, the second gas supply system may configure a metal-containing precursor supply system. Further, similar to the third gas supply system, the second gas supply system may configure a nitrogen-containing precursor supply system.

An exhaust pipe 231 for exhausting the atmosphere in the process chamber 201 is installed in the reaction tube 203. The exhaust pipe 231 is installed at a position opposite the nozzles 410, 420 and 430 in the manifold 209 so as to penetrate the side wall of the manifold 209. With this configuration, the gas supplied from the gas supply holes 410a, 420a and 430a to the vicinity of the wafers 200 in the process chamber 201 flows in the horizontal direction, in other words, in the direction parallel to the surfaces of the wafers 200, and then flows downward. The gas is exhausted from the exhaust pipe 231.

A pressure sensor 245 as a pressure detector (pressure detection part) for detecting a pressure inside the process chamber 201, an APC (Auto Pressure Controller) valve 243, a vacuum pump 246 as a vacuum exhaust device are connected to the exhaust pipe 231 in order from the upstream side. The APC valve 243 is an exhaust valve and functions as a pressure regulation part. An exhaust system, that is, an exhaust line mainly includes the exhaust pipe 231, the APC valve 243 and the pressure sensor 245. Further, the vacuum pump 246 may be included in the exhaust system.

The APC valve 243 is configured so that the pressure inside the process chamber 201 may be regulated by adjusting a valve opening degree of the APC valve 243 in a state in which the vacuum pump 246 is operated.

A temperature sensor 263 as a temperature detector is installed in the reaction tube 203. By adjusting an amount of electricity supplied to the heater 207 based on temperature information detected by the temperature sensor 263, a temperature inside the process chamber 201 is set to have a desired temperature distribution. Similar to the nozzles 410, 420 and 430, the temperature sensor 263 is formed in an L-shape and is installed along the inner wall of the reaction tube 203.

Figure 3:
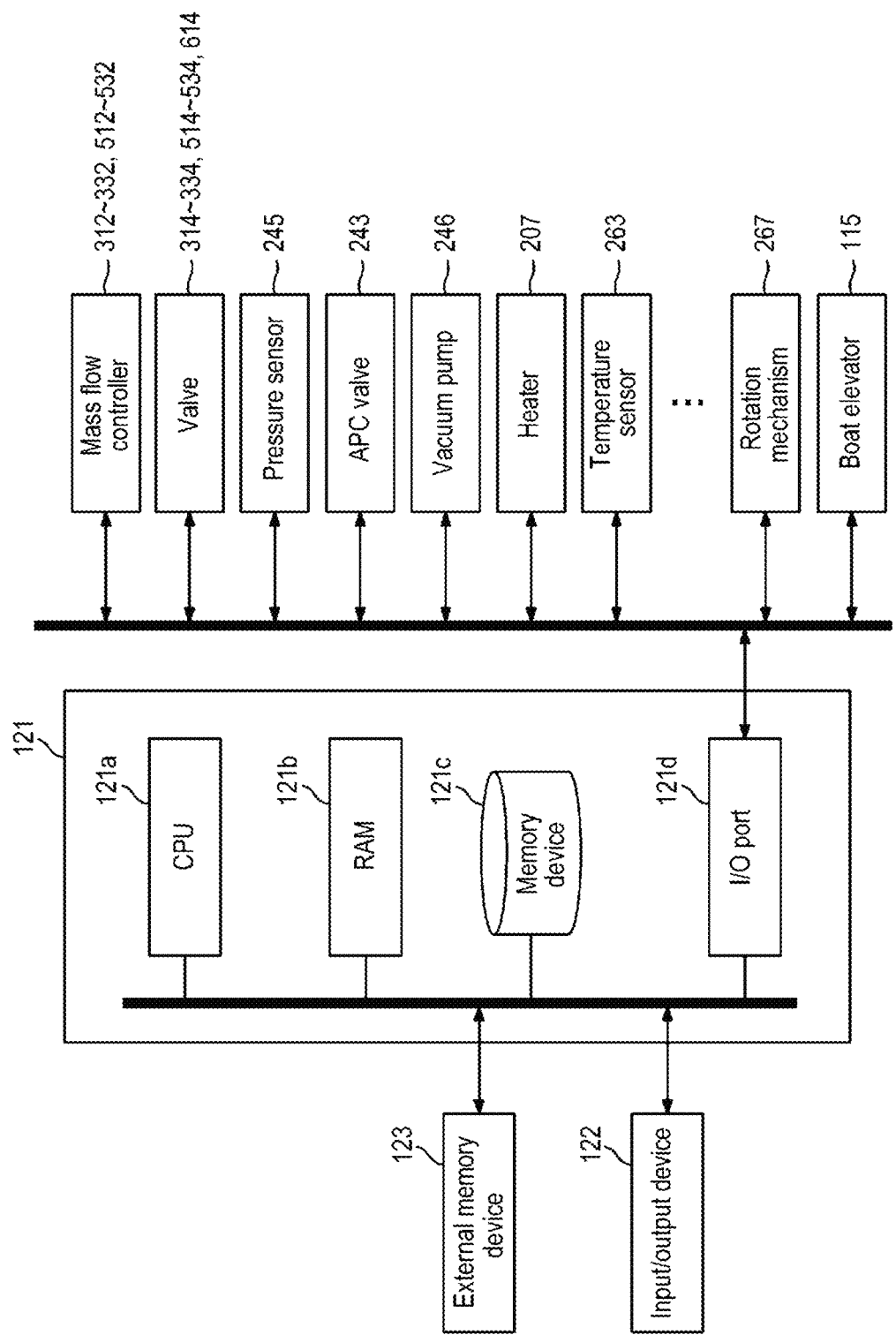
FIG. 3 illustrates an example of a controller configuration that may be used in an embodiment of the present disclosure.

As shown in FIG. 3, a controller 121 is configured as a computer including a CPU (Central Processing Unit) 121a, a RAM (Random Access Memory) 121b, a memory device 121c and an I/O port 121d. The RAM 121b, the memory device 121c and the I/O port 121d are configured to exchange data with the CPU 121a via an internal bus. An input/output device 122 configured as, for example, a touch panel or the like is connected to the controller 121.

The memory device 121c is composed of, for example, a flash memory, an HDD (Hard Disk Drive), or the like. In the memory device 121c, a control program for controlling the operation of the substrate processing apparatus, a process recipe from which the substrate processing processes, conditions and the like to be described later are written, and the like, are readably-stored. The process recipe is combined to have the controller 121 execute the respective procedures in a substrate processing process, which will be described below, so as to obtain a predetermined result. The process recipe functions as a program. Hereinafter, the process recipe, the control program and the like are collectively and simply referred to as a program in some cases. In addition, the RAM 121b is configured as a memory area (work area) in which programs, data, and the like read by the CPU 121a are temporarily held.

The I/O port 121d is connected to the aforementioned MFCs 312, 322, 332, 512, 522 and 532, the valves 314, 324, 334, 514, 524 and 534, the APC valve 243, the pressure sensor 245, the vacuum pump 246, the heater 207, the temperature sensor 263, the rotation mechanism 267, the boat elevator 115 and the like.

The CPU 121a is configured to read the control program from the memory device 121c and executes the control program, and read the process recipe from the memory device 121c in response to an input of an operation command from the input/output device 122 or the like. The CPU 121a is configured to, in accordance with the process recipe thus read, control an operation of adjusting flow rates of various gases by the MFCs 312, 322, 332, 512, 522 and 532, an operation of opening and closing the valves 314, 324, 334, 514, 524 and 534, an operation of opening and closing the APC valve 243, a pressure adjustment operation by the APC valve 243 based on the pressure sensor 245, a temperature adjustment operation of the heater 207 based on the temperature sensor 263, start and stop of the vacuum pump 246, operations of rotating the boat 217 and adjusting a rotation speed of the boat 217 by the rotation mechanism 267, an operation of elevating the boat 217 by the boat elevator 115, and the like.

The controller 121 is not limited to the case where it is configured as a dedicated computer, but may be configured as a general-purpose computer. For example, the controller 121 according to the present embodiment may be configured by installing a program in a general-purpose computer using an external memory device (e.g., a semiconductor memory such as a USB memory, a memory card or the like) 123 which stores the aforementioned program. Means for supplying the program to the computer is not limited to the supply of the program via the external memory device 123. For example, the program may be supplied using a communication means such as the Internet or a dedicated line without going through the external memory device 123. The memory device 121c and the external memory device 123 are configured as a computer-readable recording medium. Hereinafter, the memory device 121c and the external memory device 123 are collectively and simply referred to as a recording medium. In the present disclosure, the term "recording medium" may include only the memory device 121c, only the external memory device 123, or both.

(2) Substrate Processing Process
<Metal Film Forming Process>

Next, a metal film forming process will be described. The metal film forming process is executed as one of the semiconductor device manufacturing processes using the process furnace 202 of the substrate processing apparatus 10 described above.

In the present disclosure, the term "substrate" may be synonymous with the term "wafer." In that case, "wafer" may be replaced with "substrate" in the above description.

Further, in the present disclosure, the term "metal film" means a film formed of a conductive substance containing a metal atom and includes a conductive metal nitride film, a conductive metal oxide film, a conductive metal oxynitride film, a conductive metal composite film, a conductive metal alloy film, a conductive metal silicide film, a conductive metal carbide film, a conductive metal carbonitride film and the like.

Figure 4:
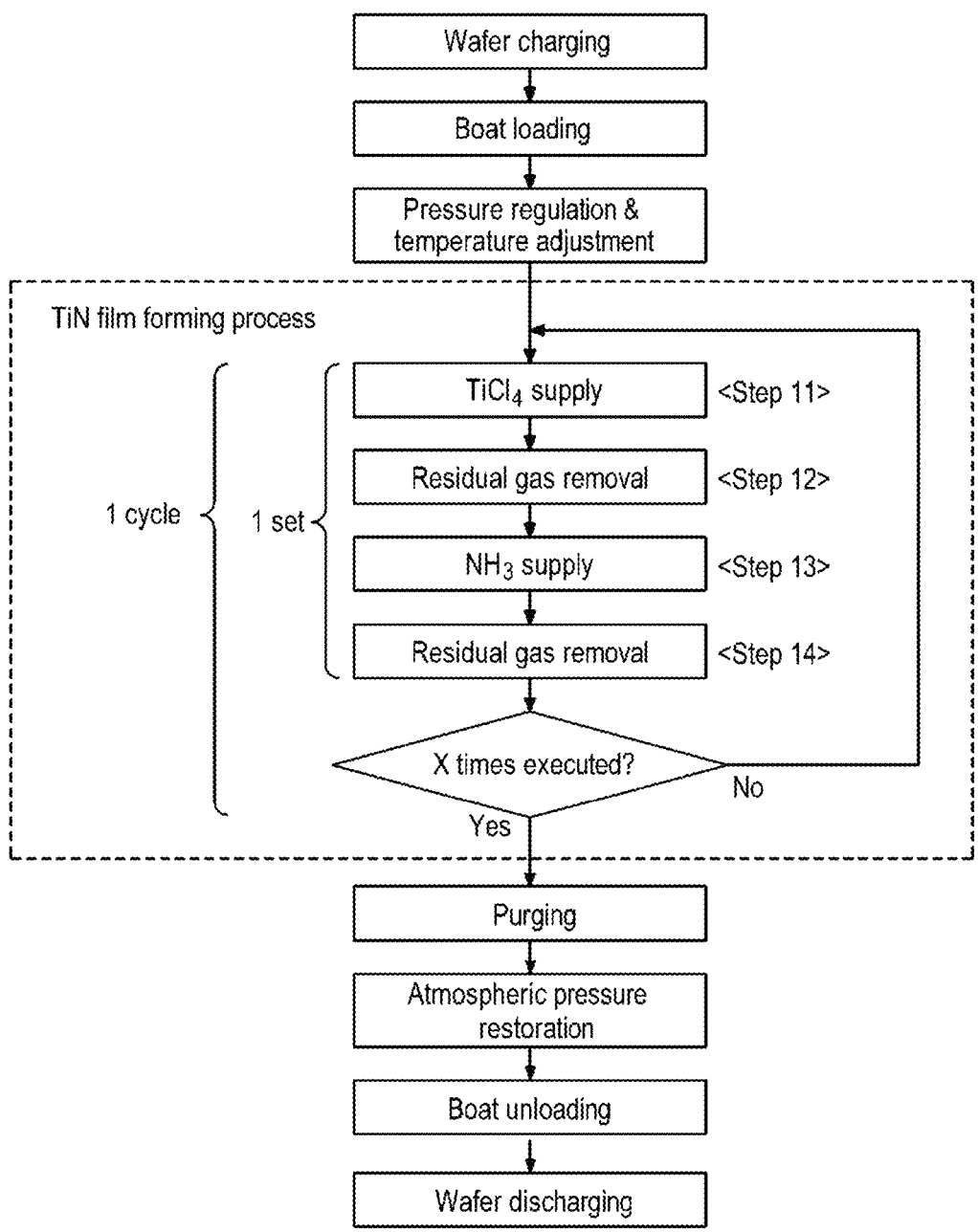
FIG. 4 is a flow chart showing a substrate processing process that may be used in an embodiment of the present disclosure.

FIG. 4 is a process flowchart showing an example of a process of forming a metal film (TiN film). In the following description, operations of the respective parts included in the substrate processing apparatus 10 are controlled by the controller 121.

(Wafer Charging and Boat Loading)

When a plurality of wafers 200 is charged in the boat 217, as shown in FIG. 1, the boat 217 supporting the plurality of wafers 200 is lifted by the boat elevator 115 and is loaded into the process chamber 201. In this state, the seal cap 219 closes a lower end opening of the reaction tube 203 via the O-ring 220.

(Pressure Regulation and Temperature Adjustment)

The inside of the process chamber 201 is vacuum-evacuated by the vacuum pump 246 so as to have a desired pressure (degree of vacuum). At this time, the pressure inside the process chamber 201 is measured by the pressure sensor 245, and the APC valve 243 is feedback-controlled based on the measured pressure information (pressure adjustment). Further, the inside of the process chamber 201 is heated by the heater 207 so as to have a desired temperature. At this time, an amount of electricity supplied to the heater 207 is feedback-controlled based on the temperature information detected by the temperature sensor 263 so that the inside of the process chamber 201 has a desired temperature distribution (temperature adjustment). Subsequently, the rotation of the boat 217 and the wafers 200 is started by the rotation mechanism 267.

At least until the processing on the wafers 200 is completed, the vacuum pump 246 is constantly kept in operation. The heating of the process chamber 201 by the heater 207 and the rotation of the boat 217 and the wafers 200 by the rotation mechanism 267 are continuously performed.

Subsequently, a process of forming a TiN layer (step 11 to step 14) is executed.

<Step 11> (Supply of $TiCl_4$ Gas)

The valve 314 of the gas supply pipe 310 is opened, and a $TiCl_4$ gas as a first precursor is supplied into the gas supply pipe 310. A flow rate of the $TiCl_4$ gas flowing through the gas supply pipe 310 is adjusted by the MFC 312. The flow-rate-adjusted $TiCl_4$ gas is supplied into the process chamber 201 from the gas supply holes 410a of the nozzle 410, and is exhausted from the exhaust pipe 231. At this time, the $TiCl_4$ gas is supplied to the wafers 200. At the same time, the valve 514 is opened to supply an inert gas such as an $N_2$ gas or the like into the carrier gas supply pipe 510. A flow rate of the $N_2$ gas flowing through the carrier gas supply pipe 510 is adjusted by the MFC 512. The flow-rate-adjusted $N_2$ gas is supplied into the process chamber 201 together with the $TiCl_4$ gas, and is exhausted from the exhaust pipe 231. At this time, the valves 524 and 534 are opened to supply the $N_2$ gas into the carrier gas supply pipe 520 and the carrier gas supply pipe 530 in order to prevent the $TiCl_4$ gas from entering the nozzle 420 and the nozzle 430. The $N_2$ gas is supplied into the process chamber 201 via the gas supply pipe 320, the gas supply pipe 330, the nozzle 420 and the nozzle 430, and is exhausted from the exhaust pipe 231.

At this time, the APC valve 243 is appropriately adjusted to set the pressure in the process chamber 201 to, for example, a pressure falling within a range of 1 to 10,000 Pa. The supply flow rate of the $TiCl_4$ gas controlled by the MFC 312 is set to, for example, a flow rate falling within a range of 10 to 10,000 sccm. The supply flow rate of the $N_2$ gas controlled by the MFCs 512, 522 and 532 is set to, for example, a flow rate falling within a range of 10 to 10,000 sccm. A time for supplying the $TiCl_4$ gas to the wafers 200, that is, a gas supply time (irradiation time) is set to, for example, a time falling within a range of 0.1 to 120 seconds. In this case, the temperature of the heater 207 is set such that the temperature of the wafers 200 is kept at, for example, a temperature falling within a range of 200 to 500 degrees C. By supplying the $TiCl_4$ gas, for example, a Ti-containing layer having a thickness of less than one atomic layer to several atomic layers is formed on the wafer 200.

<Step 12> (Residual Gas Removal)

After the Ti-containing layer is formed, the valve 314 of the gas supply pipe 310 is closed and the supply of $TiCl_4$ gas is stopped. At this time, the inside of the process chamber 201 is evacuated by the vacuum pump 246 while keeping the APC valve 243 of the exhaust pipe 231 opened, and the $TiCl_4$ gas unreacted or contributed to the formation of the Ti-containing layer, which remains in the process chamber 201, is removed from the inside of the process chamber 201. At this time, the valves 514, 524 and 534 are kept opened, and the supply of the $N_2$ gas into the process chamber 201 is maintained. The $N_2$ gas acts as a purge gas, thereby enhancing the effect of removing the $TiCl_4$ gas unreacted or contributed to the formation of the Ti-containing layer, which remains in the process chamber 201, from the inside of the process chamber 201.

<Step 13> (Supply of $NH_3$ Gas)

After removing the residual gas remaining in the process chamber 201, the valve 334 of the gas supply pipe 330 is opened and an $NH_3$ gas is supplied into the gas supply pipe 330. A flow rate of the $NH_3$ gas flowing through the gas supply pipe 330 is adjusted by the MFC 332. The flow-rate-adjusted $NH_3$ gas is supplied into the process chamber 201 from the gas supply holes 430a of the nozzle 430. The $NH_3$ gas supplied into the process chamber 201 is activated by heat and is then exhausted from the exhaust pipe 231. At this time, the thermally activated $NH_3$ gas is supplied to the wafers 200. At the same time, the valve 534 is opened to supply the $N_2$ gas into the carrier gas supply pipe 530. The flow rate of the $N_2$ gas flowing through the carrier gas supply pipe 530 is adjusted by the MFC 532. The $N_2$ gas is supplied into the process chamber 201 together with the $NH_3$ gas, and is exhausted from the exhaust pipe 231. At this time, in order to prevent the $NH_3$ gas from entering the nozzles 410 and 420, the valves 514 and 524 are opened and the $N_2$ gas is supplied into the carrier gas supply pipes 510 and 520. The $N_2$ gas is supplied into the process chamber 201 via the gas supply pipes 310 and 320, the nozzle 410 and the nozzle 420, and is exhausted from the exhaust pipe 231.

When the NH$_3$ gas is supplied by thermally activating the same, the APC valve 243 is properly adjusted to set the pressure in the process chamber 201 to, for example, a pressure falling within a range of 1 to 10,000 Pa. The supply flow rate of the NH$_3$ gas controlled by the MFC 332 is set to, for example, a flow rate falling within a range of 10 to 50,000 sccm. The supply flow rate of the N$_2$ gas controlled by the MFCs 512, 522 and 532 is set to, for example, a flow rate falling within a range of 10 to 10,000 sccm. The time for supplying the thermally activated NH$_3$ gas to the wafers 200, i.e., gas supply time (irradiation time) is set to, for example, a time falling within a range of 0.1 to 120 seconds. At this time, as in step 11, the temperature of the heater 207 is set such that the temperature of the wafers 200 is kept at, for example, a temperature falling within a range of 200 to 500 degrees C.

At this time, the gas flowing into the process chamber 201 is the NH$_3$ gas thermally activated by increasing the pressure in the process chamber 201. The activated NH$_3$ reacts with at least a part of the Ti-containing layer formed on the wafer 200 in step 11. As a result, the Ti-containing layer is nitrided and modified into a titanium nitride layer (TiN layer).

<Step 14> (Residual Gas Removal)

After forming the TiN layer, the valve 334 of the gas supply pipe 330 is closed and the supply of the NH$_3$ gas is stopped. At this time, while keeping the APC valve 243 of the exhaust pipe 231 opened, the inside of the process chamber 201 is evacuated by the vacuum pump 246. The NH$_3$ gas unreacted or contributed to the formation of the TiN layer and a reaction byproduct, which remain in the process chamber 201, are removed from the inside of the process chamber 201. At this time, the valves 514, 524 and 534 are kept opened, and the supply of the N$_2$ gas into the process chamber 201 is maintained. The N$_2$ gas acts as a purge gas, thereby enhancing the effect of removing the NH$_3$ gas unreacted or contributed to the formation of the TiN layer and the reaction byproduct, which remain in the process chamber 201, from the inside of the process chamber 201.

The processes from step 11 to step 14 described above is executed X times (first predetermined number of times) set in advance. That is, the processes from step 11 to step 14 is assumed to be one set and the processes are executed by X sets. In this manner, the TiCl$_4$ gas supply and the NH$_3$ gas supply are alternately performed X times, whereby a TiN layer (first layer) having a predetermined thickness (of, for example, 0.03 to 20 nm) is formed.

(Purging and Atmospheric Pressure Restoration)

When the film formation process for forming the TiN film having a predetermined thickness is performed, an inert gas such as N$_2$ or the like is supplied into the process chamber 201, and is exhausted from the exhaust tube 231, whereby the inside of the process chamber 201 is purged with the inert gas (gas purging). Thereafter, the atmosphere in the process chamber 201 is replaced by the inert gas (inert gas replacement), and the pressure in the process chamber 201 is restored to atmospheric pressure (atmospheric pressure restoration).

(Boat Unloading and Wafer Discharging)

Thereafter, the seal cap 219 is lowered by the boat elevator 115, and the lower end of the reaction tube 203 is opened. The processed wafers 200 supported by the boat 217 are unloaded from the lower end of the reaction tube 203 to the outside of the reaction tube 203. Thereafter, the processed wafers 200 are taken out from the boat 217.

Figure 5:
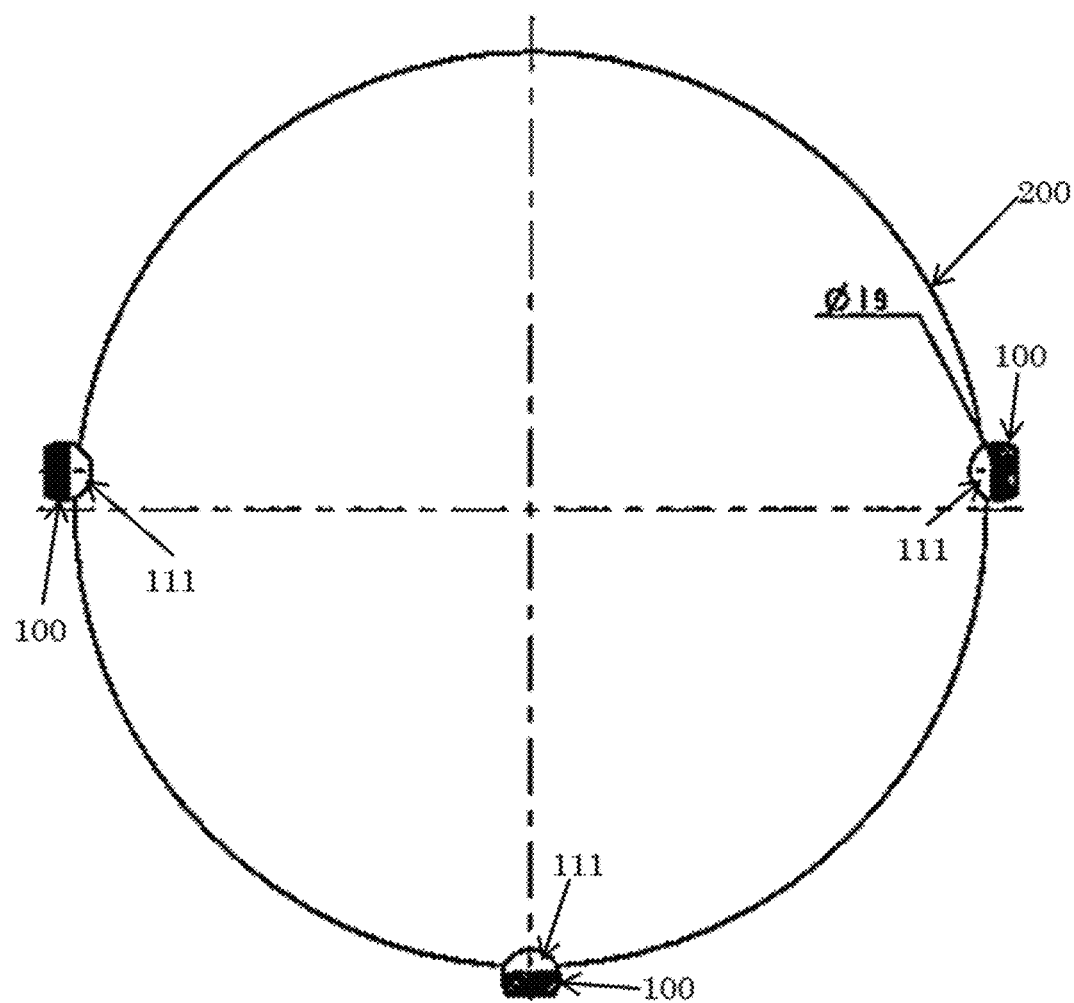
FIG. 5 is a view showing a comparative example of a substrate holder that may be used in an embodiment of the present disclosure.

As shown in FIG. 5, in the mounting portions 111 provided in the grooves formed on the support column 100 of the conventional boat, the distance between the end portion of the wafer 200 and the support column 100 is insufficient. Due to the influence of gas consumption by the support column 100, it is impossible to secure the film thickness uniformity on the surface of the wafer 200. Particularly, along with the recent trend of film thickness reduction, it is not possible to ignore the influence of the support column 100 on the decrease in the film thickness uniformity.

Figure 6:
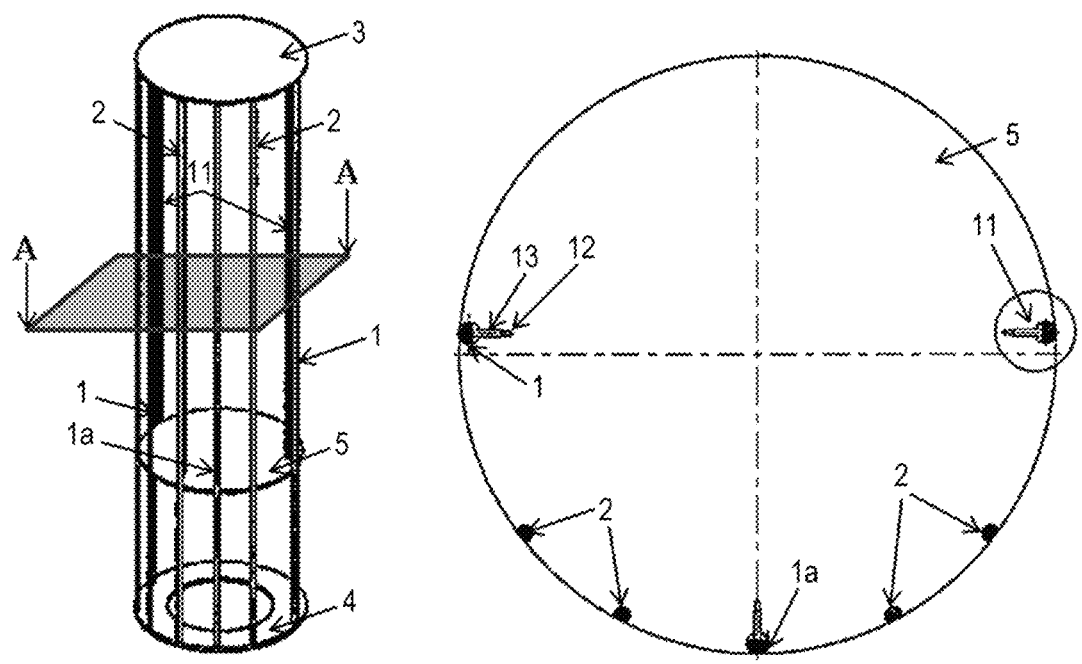
FIG. 6 is an outline view showing an example of a substrate holder that may be used in an embodiment of the present disclosure and a sectional view taken along line A-A.

The boat 217 according to the present embodiment shown in FIG. 6 includes a support column 1 provided on an outer periphery of each of a top plate 3 and a bottom plate 4 and configured to hold a wafer 200, and an auxiliary support column 2 provided on the outer periphery of each of the top plate 3 and the bottom plate 4 and having a smaller diameter than that of the support column 1. A support pin (hereinafter, also referred to as a mounting tool) 11 as a mounting part for mounting the wafer 200 thereon is installed on the support column 1. When the wafer 200 is mounted on the mounting part 11, the end portion of the wafer 200 and the support column 1 are spaced apart from each other by a predetermined length.

Further, according to the present embodiment, the support column 1 and the auxiliary support column 2 are respectively provided on the outer peripheries of the top plate 3 and the bottom plate 4. Therefore, by reducing the diameters of the support column 1 and the auxiliary support column 2, it is possible to increase the distance between the end portion of the wafer 200 and each of the support column 1 and the auxiliary support column 2. Specifically, the diameter of the support column 1 is set such that, while maintaining a strength with which the wafer 200 can be mounted on the attached mounting part 11, the distance between the support column 1 and the end portion of the wafer 200 becomes a predetermined length when the wafer 200 is supported by the attached mounting part 11.

The mounting part 11 includes a contact portion 12 that makes contact with the wafer 200 and a main body portion 13 that extends between the support column 1 and the contact portion 12. For example, a step may be provided at a boundary between the contact portion 12 and the main body portion 13 in some embodiments. With such a configuration, when the wafer 200 is held by the mounting part 11 (or the contact portion 12), the end portion of the wafer 200 and the surface of the support column 1 are spaced apart from each other by the distance substantially equal to the length of the main body portion 13. Accordingly, the length of the main body portion 13 is determined so that the predetermined length becomes an optimum value. In addition, the mounting part 11 (the contact portion 12 and the main body portion 13) has a cylindrical shape and the cross section thereof is circular.

Figure 7:
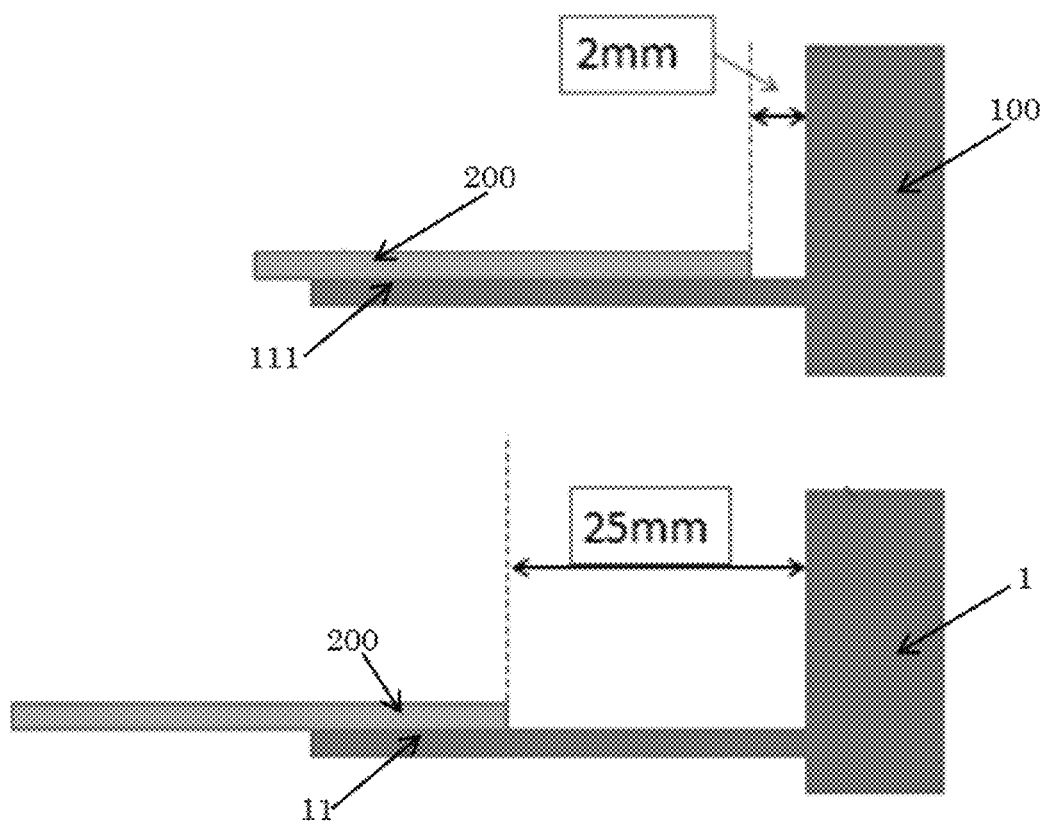
FIG. 7 is a view for explaining a difference between a distance from a substrate holder to an end portion of a wafer in the related art and a distance from a substrate holder to an end portion of a wafer in the present disclosure.
Figure 8A:
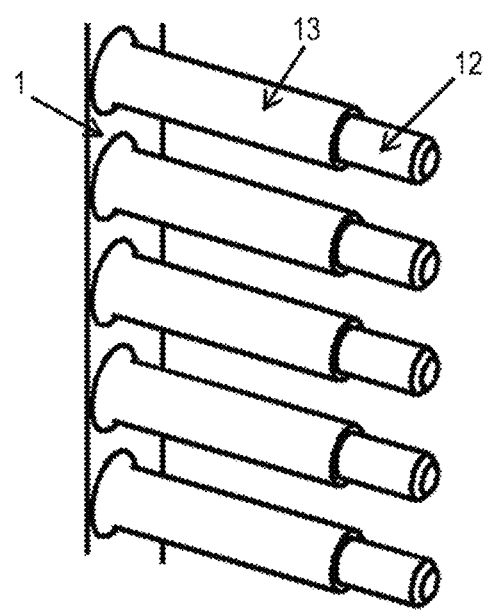
FIG. 8A is an outline view showing an example of a mounting part that is attached to a support column of a substrate holder that may be used in an embodiment of the present disclosure.
Figure 8B:
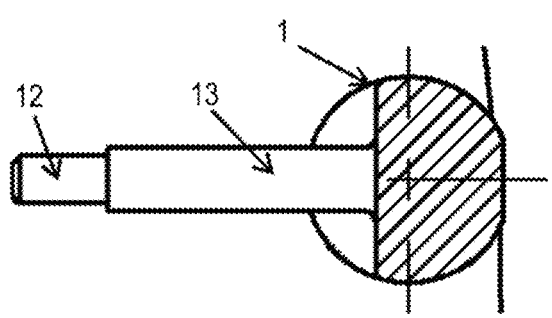
FIG. 8B is a sectional view showing an example of a mounting part that is attached to a support column of a substrate holder suitably used in an embodiment of the present disclosure.

In the conventional boat 217, the distance from the surface of the support column 1 to the end portion of the wafer 200 is as short as 2 mm. Therefore, the influence of the support column 100 is a concern. However, for example, as shown in FIG. 7, in the boat 217 according to the present disclosure, the distance from the surface of the support column 1 to the end portion of the wafer 200 can be made 10 times or more as large as 2 mm (for example, 25 mm), so that the processing on the wafer 200 may not be influenced by the support column 1. Moreover, for example, as shown in FIGS. 8A and 8B, the mounting part 11 attached to the boat 217 according to the present disclosure includes at least the main body portion 13 attached to the groove of the boat 217 and the contact portion 12 configured to mount the wafer 200 thereon. A step is provided between the contact portion 12 and the main body portion 13 so that the wafer 200 can be positioned. With such a configuration, the predetermined length from the support column 1 to the end portion of the wafer 200 can be changed by changing the length of the main body portion 13. In other words, the main body portion 13 is appropriately selected according to the size of the diameter of the support column 1, the size of the diameter of the wafer 200, and the like. In this manner, a support pin (mounting tool) 11 includes the contact portion 12 and the main body portion 13.

Further, as shown in FIG. 6, the auxiliary support column 2 is provided at a position which equally divides the distance between the support columns 1. Specifically, the boat 217 is configured so that the support columns 1 and the auxiliary support columns 2 are spaced apart from each other or the auxiliary support columns 2 are spaced apart from each other at equal intervals in the circumferential direction. As shown in FIG. 6, the boat 217 includes a plurality of support columns 1. A reference support column 1a is installed in a direction where the wafers 200 are mounted, and the support columns 1 are provided symmetrically with respect to the direction where the wafers 200 are mounted with having the reference support column 1a as a center. Even when the auxiliary support columns 2 are installed, the support columns 1 and the auxiliary support columns 2 in the boat 217 are provided symmetrically with respect to the direction where the wafers 200 are mounted with having the reference support column 1a as a center.

Figure 9:
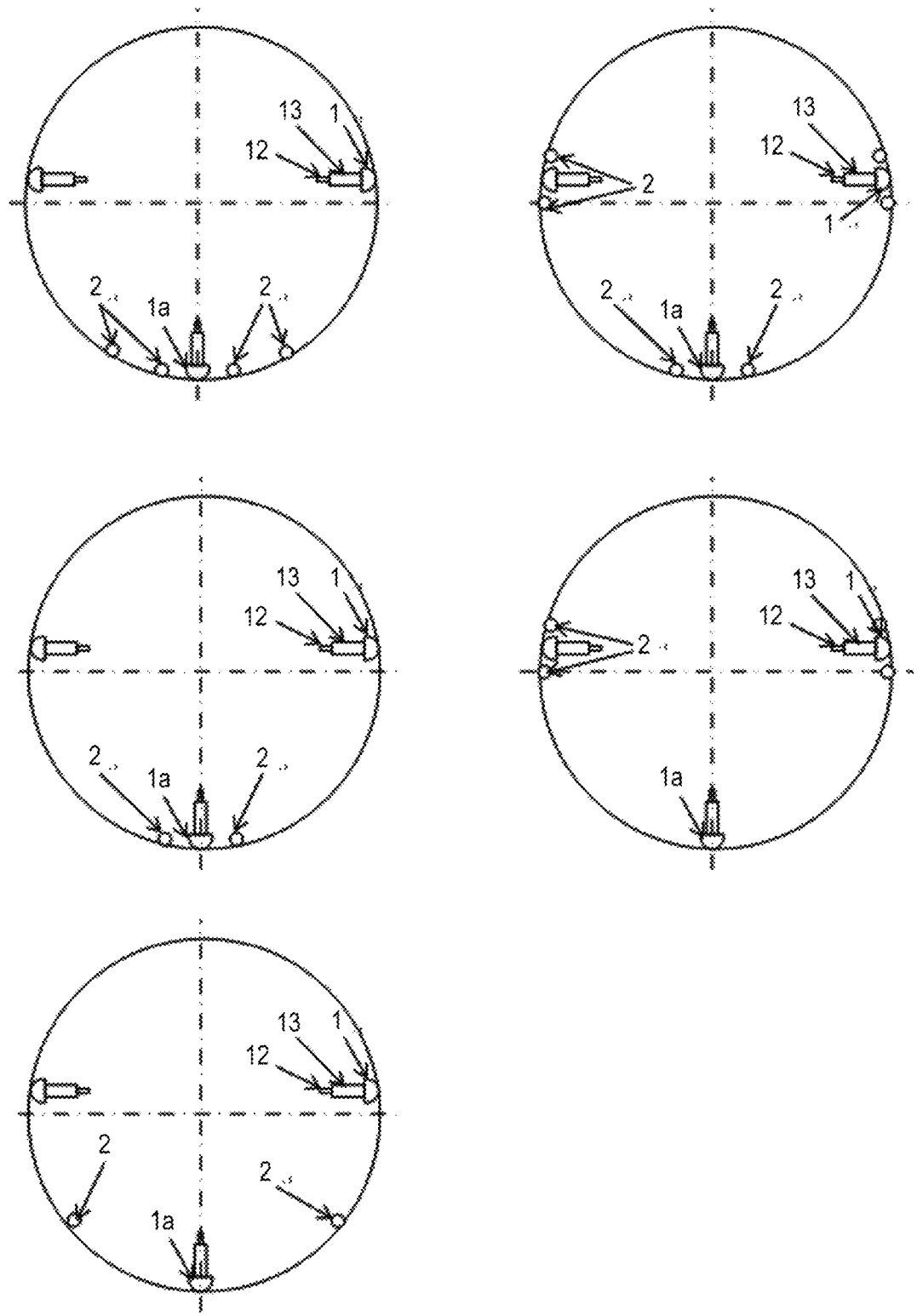
FIG. 9 is a sectional view showing a positional relationship between support columns and auxiliary support columns that may be used in an embodiment of the present disclosure.

In addition, the diameter of the auxiliary support column 2 is smaller than the diameter of the support column 1. The auxiliary support column 2 is configured not to have the mounting part 11. This is because the auxiliary support column 2 is auxiliary. The number of auxiliary support columns 2 may not be four. If the support column 1 can secure a certain degree of strength, it is unnecessary to attach the auxiliary support column 2. In the present embodiment, three support columns 1 and four auxiliary support columns 2 are provided at equal intervals between the support columns 1 and the auxiliary support columns 2 or between the auxiliary support columns 2 in the circumferential direction of the wafer 200. However, the present disclosure is not limited to this form. Various configurations are conceivable as shown in FIG. 9.

Since the support columns 1 of the boat 217 of the present disclosure are thinner than the support columns 1 of the conventional boat 217, several support columns 1 are attached for the purpose of securing strength. For example, a diameter φ of the support column 1 of the conventional boat 217 shown in FIG. 5 is 19 mm. The diameter φ of the support column 1 of the boat 217 of the present disclosure shown in FIG. 6 is 13 mm, and a diameter φ of the auxiliary support column 2 is 10 mm. In this way, the diameter (φ13 mm) of the support column 1 of the boat 217 of the present disclosure shown in FIG. 6 is thinner by 6 mm than the diameter (φ19 mm) of the support column 100 of the conventional boat 217 shown in FIG. 5. The distance from the support column 1 to the end portion of the wafer 200 can be kept twice or more (5 mm or more). Further, the diameter of the support column 1 is set in advance so that the support column 1 has the strength with which the wafer 200 may be mounted on the mounting part 11. Therefore, the diameter (φ13 mm) of the support column 1 according to the present embodiment is nothing more than an example. The present embodiment also includes a case where the diameter of the support column 1 having the strength with which the wafers 200 may be mounted is 10 mm or less depending on material of the diameter of the support column 1.

For example, if the diameter of the support column 1 decreases, a flow of a film-forming gas is less likely to be hindered. Thus, it is clear that stagnation of the film-forming gas hardly occurs. Further, since a surface area of the support column 1 becomes small, it can be easily noted that consumption of the film-forming gas decreases. Therefore, it is considered that an optimum distance from the support column 1 to the end portion of the wafer 200 becomes shorter as the diameter of the support column 1 grows smaller. On the other hand, in some embodiments, the diameter of the auxiliary support column 2 may be set as small as possible because it is unnecessary to install the mounting part 11 in the auxiliary support column 2 and it is unnecessary for the auxiliary support column 2 to have a strength with which the wafer 200 may be supported. However, if the diameter is too small, deformation due to heat may be remarkable. Thus, the diameter φ of the auxiliary support column 2 may be 8 mm or more.

In addition, the boat 217 according to the present disclosure shown in FIG. 6 includes a separation plate 5 for partitioning a substrate processing region which is a region for holding a substrate and a heat insulating region which is a region for holding a heat insulating plate. Grooves are formed on the support column 1 from the substrate processing region to the heat insulating region, and the mounting part 11 is attached to the groove of the support column 1 in the substrate processing region. Even in the support column 1, a groove for mounting the heat insulating plate is formed in the heat insulating region. No grooves are formed in the auxiliary support column 2 as a whole. Thus, the wafer 200 and the heat insulating plate cannot be mounted on the auxiliary support column 2.

In the present embodiment, since the boat 217 is characterized by the distance between the wafer 200 and the support column 1 in the substrate processing region and the mounting state of the wafer 200 and the mounting part 11. Therefore, it is not necessary to provide a heat insulating region in the lower portion of the boat 217. For example, the boat 217 shown in FIG. 13 has a configuration excluding the heat insulating region of the boat 217 according to the present embodiment, and other configurations remain the same. That is, the boat 217 shown in FIG. 13 also has the same effect as that of the boat 217 according to the present embodiment shown in FIG. 6.

Figure 13:
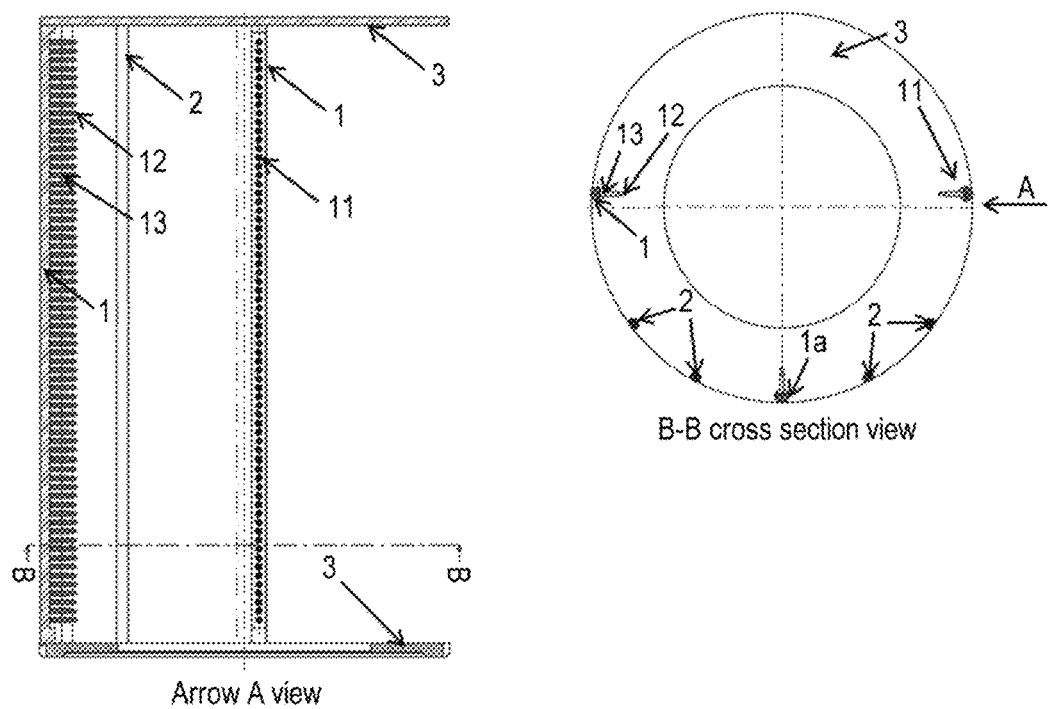
FIG. 13 is a side view showing another example of a substrate holder that may be used in an embodiment of the present disclosure and a sectional view showing a cross section taken along B-B line.

Accordingly, as for the boat 217 shown in FIG. 13, the diameter of the auxiliary support column 2 is smaller than the diameter of the support column 1. When the wafer 200 is held by the mounting part 11, the end portion of the wafer 200 and the surface of the support column 1 are spaced apart by a predetermined length. Further, the support column 1 of the boat 207 is made thin as long as the wafer 200 can be held by the mounting part 11. By properly selecting the length of the main body portion 13 of the mounting part 11, it is possible to freely determine the predetermined length between the end portion of the wafer 200 and the support column 1. In addition, as shown in FIG. 9, various pattern configurations of the auxiliary support column 2 may be considered.

Further, although not shown, four support columns may be provided. In short, it is only necessary that the support column 1 and the end portion of the wafer 200 are spaced apart by a predetermined length or more. For example, as long as the distance between the support column 1 and the end portion of the wafer 200 is sufficiently long when the wafer 200 is held by the boat 217, the support column 1 may be made larger.

(Regarding the Influence of the Support Column of the Boat)

The result of verifying the influence of the support column 1 of the boat 217 on the wafer 200 in detail will now be described with reference to FIGS. 10 to 12.

Figure 10:
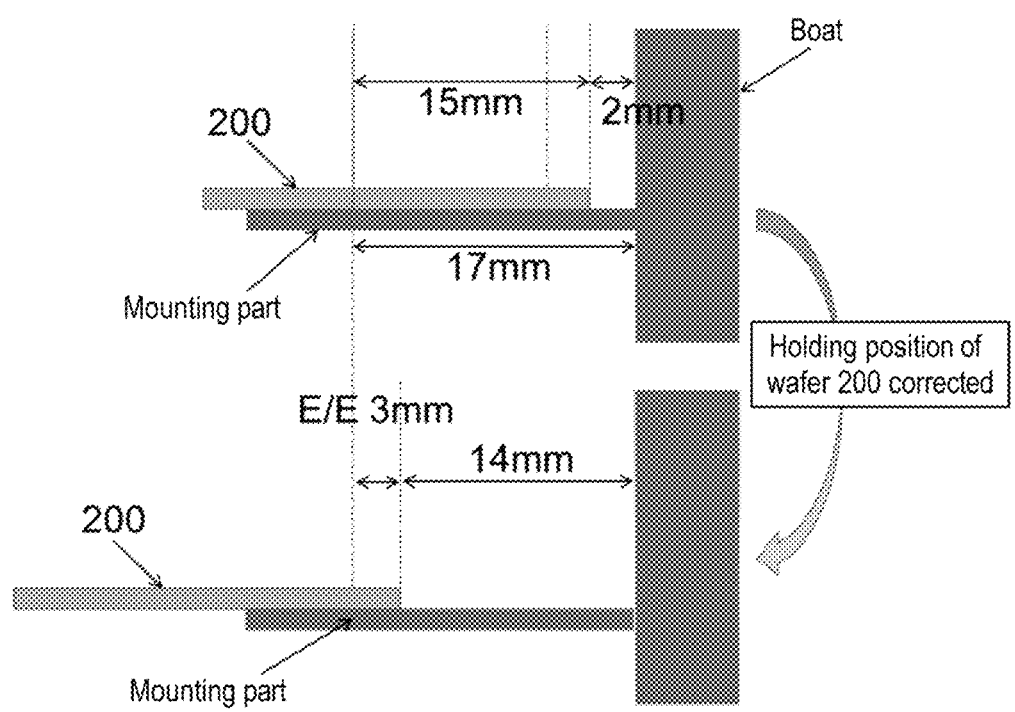
FIG. 10 is a view for explaining a distance relationship between a substrate holder that may be used in an embodiment of the present disclosure and an end portion of a wafer.
Figure 11:
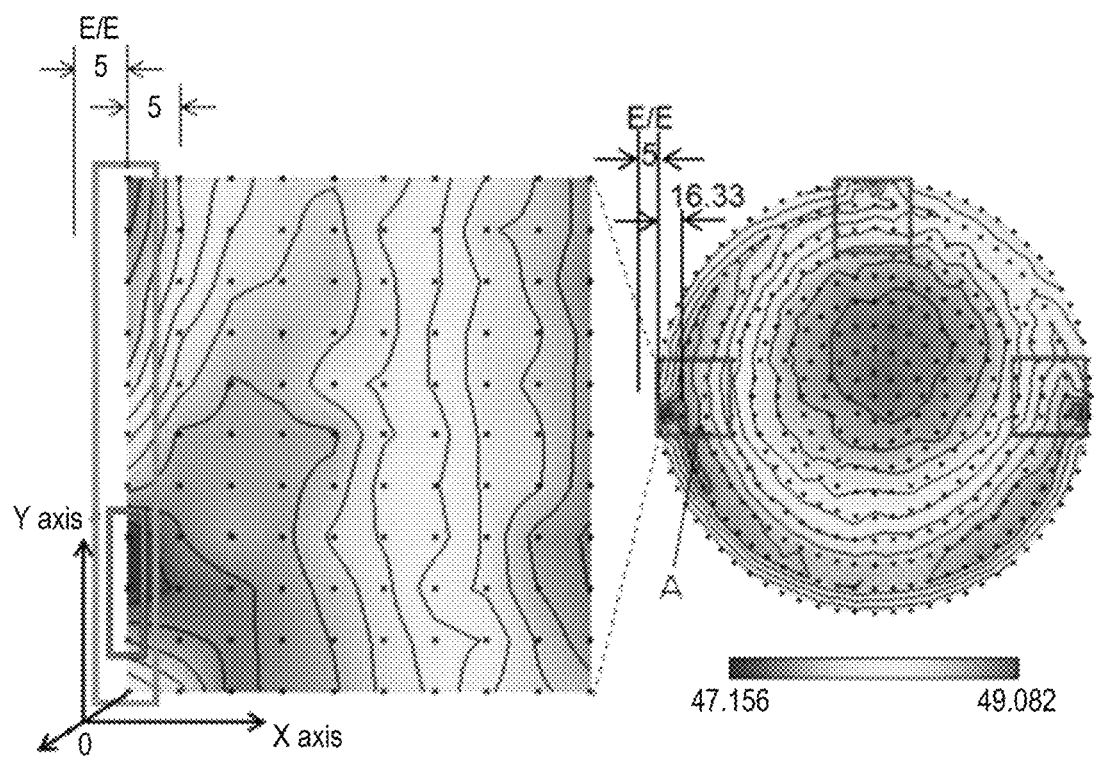
FIG. 11 is a view showing a measurement result of a film thickness of a film formed on a wafer.

First, FIG. 10 is a diagram for briefly explaining a method of calculating the distance (predetermined length) between the boat 217 and the end portion of the wafer 200 (hereinafter also referred to as a wafer edge). When it is known that the influence of the boat 217 disappears at 15 mm from the wafer edge, description will be made on the calculation of the distance (predetermined length) between the boat 217 and the wafer edge.

In this case, the distance becomes 14 mm, which has a difference of 3 mm from a sum of the distance (2 mm) between the current boat 217 and the wafer edge and 15 mm. The E/E (Edge Exclusion) indicating a range excluded when measuring the film thickness of the wafer is 3 mm. In this way, it is simple in the case where the distance at which the influence of the boat 217 can be ignored is known in advance. However, in reality, the influence of the boat 217 involves a variety of factors. Therefore, it is necessary to perform verification by determining process conditions in advance and acquiring process data.

The results of verifying a TiN film as an example will be described with reference to FIG. 11 and the subsequent figures. FIG. 11 is a film thickness measurement result obtained by forming a TiN film on the wafer 200 and measuring the film thickness thereof. The temperature was 380 degrees C., the flow rate of a $TiCl_4$ gas was 0.45 slm (the flow rate of a carrier $N_2$ gas was 1.5 slm), and the flow rate of an $NH_3$ gas was 7.5 slm (the flow rate of a carrier $N_2$ gas was 3.4 slm). By alternately and repeatedly supplying the gases a predetermined number of times under a predetermined pressure and for a predetermined time, a TiN film was formed at a thickness of about 50 nm. The diameter φ of the support column of the boat 217 is 19 mm and the pitch is 7.7 mm.

In the present embodiment, in the whole view (enlarged view for part A) of the wafer 200 on the right side, the influence of the support column 1 of the boat 217 was verified with the film thickness in the vicinity of the support column 1 of the boat 217 (in the portion surrounded by a square). Since the verification method does not change in other parts, only the part A will be described here. Specifically, the influence of the support column 1 of the boat 217 on the film thickness is verified using the enlarged view on the left side. The number of data points is 11 points×11 points=121 points. The origin (X=0, Y=0) is a lower left measurement point. The black dots shown in FIG. 11 are measurement points of the film thickness, and the parts having the same film thickness are indicated by solid lines.

In the enlarged view on the left side, the part surrounded by a small rectangle indicates three points (a point (X=0, Y=5), a point (X=0, Y=10), and a point (X=0, Y=15)), which have the smallest film thicknesses among the measurement points with having X=0 as an X axis, and the average value of the part (3 points) surrounded by this small rectangle is defined as a Min value. Next, in the left side enlarged view, the average value of the part surrounding 11 points which are all the measurement points of X=0 is defined as an Ave value. The value obtained by dividing the Min value by the Ave value and taking the product of 100 is defined as an attenuation rate. The values of the attenuation rate when calculated with the respective X coordinates (X=0, X=5 . . . X=50) are shown in FIG. 12.

Figure 12:
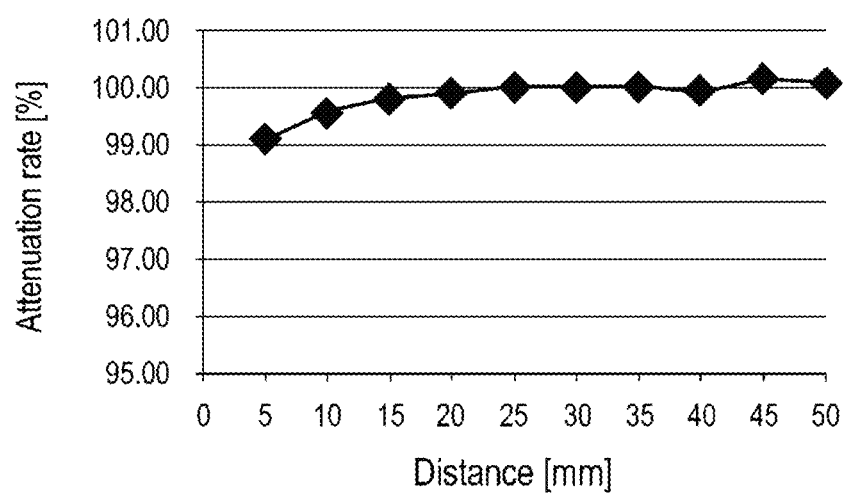
FIG. 12 is a view for explaining a distance relationship between a support column of a substrate holder that may be used in an embodiment of the present disclosure and an end portion of a wafer.

In FIG. 12, the vertical axis indicates the attenuation rate and the horizontal axis indicates the distance from the wafer edge. In this way, if the time at which the attenuation rate reaches 100% is defined as a limit point at which the influence of the support column 1 can be ignored, the limit point of the part A is 25 mm. Therefore, it is understood that under this condition, the influence of the support column 1 can be ignored if the distance between the support column 1 and the end portion of the wafer 200 is 25 mm or more.

Further, if the time at which the attenuation rate reaches 99% is defined as a limit point at which the influence of the support column 1 can be ignored, it can be seen that the influence of the support column 1 can be neglected when the predetermined length is 5 mm or more. As compared with the mounting state (2 mm) of the conventional boat 217 shown in FIG. 5, it can be seen that great improvement is achieved.

According to the present embodiment, at least one or more of the following effects (a) to (f) may be achieved.

(a) Since the distance between the end portion of the substrate and the substrate holder is maintained to be equal to or longer than a predetermined length when the substrate is held by the substrate holder, it is possible to suppress the decrease in the uniformity of the film thickness without receiving the influence of gas consumption by the substrate holder. Further, the predetermined length may be 5 mm or more, 10 mm or more, or 25 mm or more in some embodiments.

(b) The mounting part for holding the substrate is provided on the support column of the substrate holder. By mounting the substrate on the mounting part, the support column and the end portion of the substrate may be spaced apart from each other by a predetermined length (5 mm) or more. With such a configuration, it is possible to suppress the decrease in the uniformity of the film thickness without receiving the influence of gas consumption by the support column.

(c) The mounting part includes a contact portion for supporting the substrate and a main body portion extending between the support column and the contact portion. When the substrate is mounted on the contact portion, the support column and the end portion of the substrate are spaced apart by the length of the main body portion. Accordingly, by adjusting the length of the main body portion, it is possible to adjust the distance between the support column and the end portion of the substrate.

(d) In the mounting part, a step is provided between the contact portion and the main body portion, and the substrate is mounted on the contact portion. Accordingly, by adjusting the length of the main body portion, it is possible to adjust the distance between the support column and the end portion of the substrate. In addition, the length of the contact portion may be substantially the same as the length of E/E in some embodiments.

(e) According to the present embodiment, the substrate holder includes the support column to which the mounting part for mounting the substrate thereon is attached. The diameter of the support column is set such that, while maintaining the strength with which the substrate can be mounted on the mounting part attached to the support column, the distance between the support column and the end portion of the substrate becomes a predetermined length (5 mm or more) when the substrate is supported by the attached mounting part. Accordingly, it is possible to suppress the decrease in the uniformity of the film thickness without receiving the influence of gas consumption by the substrate holder.

(f) According to the present embodiment, there is provided a substrate holder including a support column to which a mounting part for mounting a substrate thereon is attached and an auxiliary support column to which a mounting part is not attached. The diameter of the auxiliary support column is smaller than the diameter of the support column. When the substrate is held by the mounting part, the end portion of the substrate and the support column are spaced apart by a predetermined length (5 mm or more). Accordingly, it is possible to suppress the decrease in the uniformity of the film thickness without receiving the influence of gas consumption by the substrate holder.

Although the embodiments of the present disclosure have been concretely described above, the present disclosure is not limited to the above-described embodiments and examples, and may be variously modified without departing from the spirit thereof.

Further, in the above-described embodiments, an example in which a film is deposited on the wafer 200 has been described. However, the present disclosure is not limited to such an example. For example, the present disclosure may also be suitably applied to a case where a process such as an oxidation process, a diffusion process, an annealing process, an etching process or the like is performed on a film or the like formed on the wafer 200.

Moreover, in the above-described embodiments, an example in which a thin film is formed using a substrate processing apparatus having a hot wall type process furnace has been described. However, the present disclosure is not limited to this example. The present disclosure may be suitably applied to a case where a thin film is formed using a substrate processing apparatus having a cold wall type process furnace.

In addition, the present disclosure is not limited to a semiconductor manufacturing apparatus for processing a semiconductor wafer, such as the substrate processing apparatus according to the present embodiment, but may be applied to an LCD (Liquid Crystal Display) manufacturing apparatus for processing a glass substrate.

This application claims the benefit of priority based on Japanese Patent Application No. 2016-023625 filed on Feb. 10, 2016, the disclosure of which is incorporated herein by reference in its entirety.

The present disclosure is applied to a substrate processing apparatus in which a boat charged with a substrate is loaded into a furnace and a reaction gas is introduced from a reaction gas introduction pipe to perform processing on the substrate in a state in which the inside of the furnace is set at a predetermined temperature while depressurizing the inside of the furnace to a predetermined pressure.

According to the present disclosure in some embodiments, it is possible to suppress the deterioration in a substrate quality without receiving the influence of gas consumption by the boat.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a substrate holder including at least one support column to which a mounting part on which a substrate is mounted is attached and at least one auxiliary support column to which the mounting part is not attached,
wherein the substrate holder is configured such that a diameter of the at least one auxiliary support column is smaller than a diameter of the at least one support column,
wherein the mounting part includes a contact part configured to support the substrate and a main body part extending between the contact part and the at least one support column,
wherein the substrate holder is configured such that when the substrate is held by the mounting part, an end portion of the substrate and the at least one support column are spaced apart from each other by a length of the main body part so as to hold the substrate with the contact part, and
wherein a distance between the end portion of the substrate and the at least one support column is changeable by changing the length of the main body part.

2. The substrate processing apparatus of claim 1, wherein the diameter of the at least one support column is set to maintain a strength with which the substrate is mountable on the mounting part attached to the support column.

3. The substrate processing apparatus of claim 1, wherein the mounting part is configured so that a step is provided between the contact part and the main body part.

4. The substrate processing apparatus of claim 1, wherein the at least one support column includes a plurality of support columns and the at least one auxiliary support column includes a plurality of auxiliary support columns,
wherein a reference support column, among the plurality of support columns, is provided in a direction where the substrate is mounted, and
wherein the plurality of support columns and the plurality of auxiliary support columns are provided symmetrically with respect to the direction where the substrate is mounted and having the reference support column as a center.

5. The substrate processing apparatus of claim 4, wherein the plurality of support columns and the plurality of auxiliary support columns are provided so that the plurality of support columns and the plurality of auxiliary support columns are provided at equal intervals and the plurality of auxiliary support columns are provided at equal intervals in a circumferential direction of the substrate.

6. The substrate processing apparatus of claim 1, wherein the distance between the end portion of the substrate and the support column and is 5 mm or more.

7. The substrate processing apparatus of claim 1, wherein the support column has a diameter of 13 mm or smaller, and the auxiliary support column has a diameter of 8 mm or greater.

8. The substrate processing apparatus of claim 1, wherein the main body part is configured to be selected according to at least one selected from the group of a size of the diameter of the support column and a size of a diameter of the substrate.

9. A substrate processing apparatus, comprising:
- a substrate holder including at least support column to which a mounting part on which a substrate is mounted is attached,
- wherein the mounting part includes a contact part configured to support the substrate and a main body part extending between the contact part and the support column,
- wherein the substrate holder is configured such that when the substrate is held by the mounting part, an end portion of the substrate and the support column are spaced apart from each other by a length of the main body part so as to hold the substrate with the contact part, and
- wherein a distance between the end portion of the substrate and the support column is changeable by changing the length of the main body part.

* * * * *